United States Patent
Osipov et al.

(10) Patent No.: US 11,889,768 B2
(45) Date of Patent: Jan. 30, 2024

(54) TRANSISTOR AND METHOD OF FABRICATION OF THE SAME INCLUDING A GATE CONTACT FORMED IN A RECESS THROUGH THE PASSIVATION DIELECTRIC LAYER IN CONTACT WITH THE ACTIVE LAYER

(71) Applicant: Ferdinand-Braun-Institut gGmbH Leibniz-Institut für Höchstfrequenztechnik, Berlin (DE)

(72) Inventors: Konstantin Osipov, Millingen aan de Rijn (NL); Hans-Joachim Wuerfl, Zeuthen (DE)

(73) Assignee: FERDINAND-BRAUN-INSTITUT GGMBH, LEIBNIZ-INSTITUT FUR HÖCHSTFREQUENZTECHNIK, Berlin (DE)

( * ) Notice: Subject to any disclaimer, the term of this patent is extended or adjusted under 35 U.S.C. 154(b) by 875 days.

(21) Appl. No.: 16/764,802

(22) PCT Filed: Oct. 17, 2018

(86) PCT No.: PCT/EP2018/078408
§ 371 (c)(1),
(2) Date: Oct. 14, 2020

(87) PCT Pub. No.: WO2019/096528
PCT Pub. Date: May 23, 2019

(65) Prior Publication Data
US 2021/0013392 A1 Jan. 14, 2021

(30) Foreign Application Priority Data
Nov. 17, 2017 (DE) ..................... 10 2017 127 182.1

(51) Int. Cl.
*H01L 41/047* (2006.01)
*H10N 30/87* (2023.01)
(Continued)

(52) U.S. Cl.
CPC ......... *H10N 30/872* (2023.02); *H10N 30/063* (2023.02); *H10N 30/852* (2023.02); *H10N 39/00* (2023.02)

(58) Field of Classification Search
CPC ............... H10N 30/872; H10N 30/063; H10N 30/852; H10N 39/00; H01L 23/3171; H01L 29/2003; H01L 29/7786
See application file for complete search history.

(56) References Cited

U.S. PATENT DOCUMENTS 5,053,348 A 10/1991 Mishra et al.
7,030,428 B2 4/2006 Saxler
(Continued)

FOREIGN PATENT DOCUMENTS

JP 2008-244001 A 10/2008
JP 2011-165749 8/2011
(Continued)

OTHER PUBLICATIONS

Cho et al.: "Low off-state Leakage Currents in AlGaN/GaN High Electron Mobility Transistors by Employing a Highly Stressed SiNx Surface Passivation Layer", WoDIM, 27.-30. Jun. 2016.
(Continued)

*Primary Examiner* — Ermias T Woldegeorgis
(74) *Attorney, Agent, or Firm* — Fox Rothschild LLP

(57) ABSTRACT

The present invention relates to a gate structure and a method for its production. In particular, the present invention relates to agate structuring of a field effect transistor (FET), wherein the field effect transistor with the same
(Continued)

active layer can be constructed as a depletion type, or D-type, as an enhancement type, or E-type, and as a low noise type, or LN-type, on a shared substrate base using a uniform method.

The gate structure according to the invention comprises a substrate; a piezoelectric active layer (112, 212) disposed on the substrate (110, 210); a passivation layer (120, 220) disposed on the active layer (112, 212), wherein the passivation layer (120, 220) has a recess (122, 222) that extends through the entire passivation layer (120, 220) in the direction of the active layer (112, 212); a contact element (140, 240) disposed within the recess (122, 222), wherein the contact element (140, 240) extends from the active layer (112, 212) to above the passivation layer (120, 220); and a cover layer (150, 250) that covers the contact element (140, 240) above the passivation layer (120, 220); wherein at least one layer disposed above the active layer is tensile stressed or compressively stressed in the area around the contact element, with a normal tension of $|\sigma|>200$ MPa, wherein via the individual stresses in the area around the contact element, a resulting force on the boundary area between the passivation layer and the active layer is set, which influences via the piezoelectric effect the electron density in the active layer in the area below the contact element.

10 Claims, 3 Drawing Sheets

(51) Int. Cl.
*H10N 30/063* (2023.01)
*H10N 30/85* (2023.01)
*H10N 39/00* (2023.01)

(56) References Cited

U.S. PATENT DOCUMENTS

| 11,538,908 | B2* | 12/2022 | Donkers | H01L 29/7786 |
| 2002/0048858 | A1 | 4/2002 | Furukawa et al. | |
| 2004/0164374 | A1* | 8/2004 | Ishikura | H01L 29/8128 257/500 |
| 2007/0164321 | A1* | 7/2007 | Sheppard | H01L 29/66462 257/256 |
| 2007/0164322 | A1* | 7/2007 | Smith | H01L 29/42312 257/256 |
| 2010/0171150 | A1* | 7/2010 | Smith | H01L 29/7787 257/213 |
| 2012/0217507 | A1* | 8/2012 | Ohki | H01L 29/205 257/E29.246 |
| 2013/0105817 | A1 | 5/2013 | Saunier | |
| 2013/0264657 | A1* | 10/2013 | Komatani | H01L 29/7787 257/402 |
| 2014/0091424 | A1* | 4/2014 | Makiyama | H01L 29/66462 257/472 |
| 2014/0367694 | A1* | 12/2014 | Kamada | H01L 23/3171 438/172 |
| 2017/0133471 | A1 | 5/2017 | Lee et al. | |
| 2021/0013392 | A1* | 1/2021 | Osipov | H10N 30/872 |

FOREIGN PATENT DOCUMENTS

| JP | 2014-138167 | | 7/2014 | |
| JP | 2015095554 A | * | 5/2015 | H01L 29/42316 |
| WO | WO-2008035403 A1 | * | 3/2008 | H01L 23/291 |

OTHER PUBLICATIONS

International Search Report issued in International Patent Application No. PCT/EP2018/078408 dated Feb. 4, 2019.
Aoteru Shigekawa et al, "Analysis of Passivation-Film-Induced Stress Effects on Electrical Properties in AlGaN/GaN HEMTs", IEICE Transactions On Electronics, Institute of Electronics, Tokyo, JP,Band E93C, Nr. 8, . Aug. 2010 (Aug. 2010), Seite 1212-1217.

\* cited by examiner

TRANSISTOR AND METHOD OF FABRICATION OF THE SAME INCLUDING A GATE CONTACT FORMED IN A RECESS THROUGH THE PASSIVATION DIELECTRIC LAYER IN CONTACT WITH THE ACTIVE LAYER

CROSS-REFERENCE TO RELATED APPLICATIONS

This application is a § 371 national phase entry of International Patent Application No. PCT/EP2018/078408, filed on Oct. 17, 2018, which claims priority to and the benefit of DE 10 2017 127 182.1, filed on Nov. 17, 2017, both of which are hereby incorporated herein by reference in their entireties.

DESCRIPTION

The present invention relates to a gate structure and a method for its production. In particular, the present invention relates to a gate structuring of a field effect transistor (FET), wherein the field effect transistor with the same active layer can be constructed as a depletion type, or D-type, as an enhancement type, or E-type, and as a low noise type, or LN-type, on a shared substrate base using a uniform method.

PRIOR ART

With field effect transistors (FET) in particular, the connection used to trigger the FET is known as a gate. Further connections are the source and the drain. The current flow between the drain and the source can be controlled by varying the voltage applied to the gate. The individual connections enable an electric contacting of the switch element and as electrodes guide the voltages and currents that are fed into the active switching section. For this reason, the gate connection is also known as the control electrode or control connection. The structural design of the gate connection and its incorporation into the related switch element is known as the gate structure.

A T-shaped gate structure, or T-gate, is known from US 2002/0048858 A1. In it, the conductive gate section of a semiconductor construction element (e.g. a metal semiconductor field effect transistor, or MeSFET), a high electron mobility transistor, or HEMT, etc. is referred to as the T-gate, the upper section of which is wider than the section on the base (i.e. in direct contact or in separate contact via a gate insulator with the active section of the semiconductor construction element). The advantage of such an arrangement is that via the narrow section of the gate in the semiconductor construction element, an extremely short channel length can be realized, as a result of which high operational frequencies and a high transconductance can be achieved, while via the wider upper gate section, a high conductivity of the T-gate enables high switching speeds (through almost loss-free charging and discharging of the gate capacity).

In U.S. Pat. No. 5,053,348 A, a method for producing a self-adjusting T-gate HEMT is disclosed. US 2013/0105817 A1 also discloses an HEMT with a T-gate structure. A strain balanced nitride-heterojunction transistor (HFET) is known from U.S. Pat. No. 7,030,428 B2. A power FET and a method for its production are known from US 2017/0133471 A1. Cho et al. disclose HEMT in AlGaN/GaN with low leakage currents in the disabled state (Cho, S.-J. et al., "Low off-state Leakage Currents in AlGaN/GaN High Electron Mobility Transistors By Employing A Highly Stressed SiNx Surface Passivation Layer", WoDIM, 27-30 Jun. 2016).

With the so-called short-channel HFETs in particular, with severely shortened gate lengths, the disabled field of the Schottky or MIS contact may no longer be sufficient to control the current flowing through the channel. Typically, therefore, in the prior art, local gate recesses in the semiconductor material or other methods are used, which either lead to a local reduction of the electron density below the gate or which make it possible to bring the gate physically closer to the channel area of the FET. As a result, however, the electron density below the gate is also continuously negatively influenced in the on-state.

A further problem in connection with the effective electron density below the gate occurs during the development of self-blocking HEMT or HFET. Typically, with these, an optimal compromise must be set between the lowest possible on-resistance and the level of the pinch-off voltage of the transistor. One method for balancing out is based on the depletion of the direct area below the gate by the electric field of a Schottky barrier. For this purpose, the gate connection must be brought very close to the 2DEG, so that the intrinsically forming space charge zone is able to deplete the 2DEG at 0 V gate voltage—the transistor blocks. This change in the channel geometry reduces the maximum possible electron concentration directly below the gate, significantly increases the gate capacity and leads to far higher electric fields in direct proximity to the gate electrode, which in turn is a reliability problem. Therefore, in order to bring the gate electrode closer, in a similar manner to short-channel HFETs, local gate recesses are used in the semiconductor material, or p-gate structures are used that are difficult to construct. However, the disadvantage of this method is that here, the electron density below the gate in the on-state of the transistor and the gate capacity are in turn negatively influenced.

With FETs, a differentiation is essentially made between a depletion type, or D-type and an enhancement type, or E-type. Depletion type transistors (D-transistors) are "normally on". Enrichment type transistors (E-transistors) are "normally off". Due to their low parasitic resistances, these transistors are used as HF power transistors, for example, in power amplifiers, or PA. In order to realize integrated electronic logic circuits, it is preferred to structure both transistor types on a shared substrate and in so doing to be able to produce them. Such a combination is frequently difficult to achieve, however, since the two transistor types generally differ both with regard to their internal structure and their electrical properties. In particular, the integration of self-blocking and self-conducting transistors on a shared epitaxial wafer presents a particular challenge for process technology.

Typically, for such an E/D integration, the epitaxial structures are epitaxied for the self-conducting D-transistors and then, during the actual structuring process, the area below the gate is locally modified using etched gate recesses or through ion implantation in the semiconductor material in order to locally change the electronic properties. Such modifications of the electronic properties permit a reduction in the electron density within the bus channel and also increase the gate capacity. In combination with the depletion zone of a Schottky or MIS structure of the gate area, this can lead to a self-blocking behavior of the transistor produced (E-transistor).

A local ion implantation in particular is very time- and cost-intensive, however. Additionally, these integrative measures also mean that the electron density below the gate can be negatively influenced in the on-state of the transistor and can certainly increase the gate capacity and the electrical field near the gate.

As well as the enrichment- and depletion-type FETs named above, a further transistor type can be delineated via the electron density in the active layer, in which the transconductance maximum occurs in the switching behavior with a gate voltage UGS of 0 V (LN-type or neutral type). The LN transistor is particularly suitable for constructing low-noise amplifier circuits, or LNA.

Particularly in the area of monolithic integrated microwave circuits (MMICs), it is desirable to monolithically integrate both power transistors and low-noise small-signal transistors on a substrate. This ability would make it possible to integrate transmission and receiving elements (transceivers) on a shared chip, i.e. on a shared substrate or epitaxy base. Both transistor types usually differ in terms of their structure. The power amplifier, or PA, is usually self-blocking, while the low-noise transistor is designed to have a neutral switching behavior. This integration technology (PA/LNA integration) requires similar technological steps to those described above. Otherwise, however, for complex circuit arrangements, the option of integrating all the transistor types named above on a shared substrate or epitaxy base (E/D/LN integration) is by all means desirable. Here, for example, corresponding logic circuitry could also be integrated on the chip for the direct processing and conversion of the transferred signals.

For many microwave applications, self-blocking transistors are of great interest since they significantly reduce the complexity of the circuit design.

To date, these self-blocking concepts have not generally been used since conventional technologies lead to transistors with a significantly reduced maximum current and a considerably increased gate capacity. These properties reduce the cutoff frequencies and therefore impair the microwave properties.

DISCLOSURE OF THE INVENTION

It is therefore an object of the present invention to provide an alternative gate structure that overcomes or at least considerably reduces the disadvantages described of the prior art. In particular, a gate structure of a field effect transistor is to be provided, which with the same active layer permits a shared structure of depletion-type, enrichment-type and/or low noise-type transistors on a shared substrate base in a uniform method. In general, the aim is to thus make the integration of transistors possible with a variable threshold voltage specified by the technology, and not by the epitaxy. The measures taken to develop the gate structure should have no influence, or only a low level of influence, on the electron density below the gate in an on-state of the transistor, i.e. the electron population in the areas between the source and the gate as well as between the gate and drain should be entirely separate from the selection of the threshold voltage. Consequently, FETs and methods to produce such FETs are disclosed, wherein the FETs according to the invention and the method for producing such FETs have gate structuring (gate structure and a method of production) according to the present invention.

These objects are attained according to the invention by means of the features of patent claim 1 and patent claim 11. Advantageous embodiments of the invention are contained in the subordinate claims.

A gate structure according to the invention comprises a substrate; a piezoelectric active layer disposed on the substrate; a passivation layer disposed on the active layer and having a thickness of between 10 nm and 1000 nm, wherein the passivation layer has a recess that extends through the entire passivation layer in the direction of the active layer, wherein the recess has a width between 10 nm and 500 nm on the boundary to the active layer; a contact element disposed within the recess, wherein the contact element extends from the active layer to above the passivation layer; and a cover layer that covers the contact element above the passivation layer; wherein at least one layer disposed above the active layer is tensile stressed or compressively stressed in the area around the contact element with a normal tension of $|\sigma|>200$ MPa, wherein via the individual stresses in the area around the contact element, a resulting force on the boundary area between the passivation layer and the active layer is set, which influences via the piezoelectric effect the electron density in the active layer in the area below the contact element, wherein the normal tensions of stressed layers lie in the range between ±4 GPa; and the ratio between the thickness of the passivation layer and the width of the recess on the boundary to the active layer is between 1.5:1 and 4:1.

Preferably, the substrate consists of SiC. Equally preferably, substrates are made of Si, sapphire, GaN and AlN.

The main electrical switching and conducting processes take place in the active layer. The active layer can have a plurality of differently structured areas or zones made of different semiconductor materials with variable doping. Preferably, the active layer can comprise AlGaN/GaN as semiconductor material. AlN/GaN, InAlN/GaN and other ternary or quaternary compounds of active layer, N and Ga can be used as further preferred material composites. In binary compositions, the respective material share can be between 0% and 100%. The active layer comprises at least one piezoelectric material, which when deformed leads to a change in the electric polarity of the material.

In particular, a passivation layer describes a passive layer that spatially and functionally delimits the active layer on its side facing away from the substrate. Here, passive means that this layer exerts no influence, or only a low level of influence, on the charging transport within the switching element. A typical example of a passivation layer is a dielectric passivation layer, preferably made of SiNx. Equally preferably, such a passivation layer comprises SiOx, SiNxOy, Al2O3, ZnO, fluorosilicate glass (FSG), benzozyclobutene (BCB) or polyimides (PI). The passivation layer can also be a spacer layer. The preferred thickness of the passivation layer is between 10 nm and 1000 nm.

Preferably, the passivation layer is developed as a highly compressively or tensile stressed dielectric layer with a normal tension of $|\sigma|>1$ GPa. In particular, the passivation layer can be a base layer developed on the entire surface of the active layer for all subsequent structuring steps, wherein all gate structures applied on the wafer are constructed on the basis of this passivation layer. For example, with a method for producing integrated structures, the active layer and a highly compressively or tensile stressed passivation layer disposed on it are applied over the surface on the substrate and serve as the initial basis for the production of a plurality of gate structures according to the invention.

Within the passivation layer, a recess is disposed according to the invention, which extends through the entire passivation layer in the direction of the active layer. This recess is a so-called "gate trench", also known as a "gate hole" or "gate via", which permits electrical access to the active zone through the intermediate layer. In this opening within the intermediate layer, a contact element is disposed.

Preferably, the recess has a width of between 10 nm and 500 nm on the boundary to the layer below. The angle of incidence of the side walls of the recess is preferably between 90° and 30°, wherein at an angle of 90°, the side wall of the recess is disposed vertically to the layer below.

The contact element is disposed within the recess and extends from the active layer to above the passivation layer. Preferably, with a gate structure according to the invention, this is a T-gate, wherein the contact element is developed as a T-shape. Here, T-shape is generally very broadly interpreted; in particular, such structures are frequently also referred to as mushroom, arrow or rivet-shaped. Any other designs of the contact element within the scope of this disclosure are also possible.

The contact element can be constructed from a Schottky metal. Preferably, this is Ir. Equally preferred are Pt, Ni, Al, Os, TiW and WSi.

A gate insulator can also be included in the gate metal, which preferably consists of Al2O3, SiNx, SiOx, SiNxOy, HfO2 or other dielectric layers. A preferred thickness of the insulation layer is between 5 nm and 40 nm.

Preferably, the contact element is fully surrounded by a dielectric cover layer in its upper area. The cover layer can in particular lie directly on the passivation layer in the areas directly adjacent to the contact element and cover the contact element from above.

The dielectric cover layer can preferably be SiNx. Equally preferred are SiOx, SiNxOy, Al2O3, ZnO, fluorosilicate glass (FSG), benzozyclobutene (BCB) and polyimides (PI). The thickness of the cover layer is preferably between 10 nm and 1000 nm.

In the prior art, the layers lying on the active layer are applied on said layer with as little stress as possible. As a result, the negative effects of mechanical stresses (potentially reduced longevity of the transistor, migration effects, influences on the electrical charging transport) are in particular intended to be prevented and a uniform material application is to be achieved. By contrast, according to the invention, at least one layer disposed above the active layer is tensile or compressively stressed in the area surrounding the contact element, with a normal tension of |σ|>200 MPa. Such a stress, e.g. in the passivation layer, can in particular be achieved by the fact that when epitaxying the passivation layer onto the active layer, the stress state is adjustable by selecting the process parameters within certain limits.

Modern CVD processes such as those known from silicon technology make it possible to produce tensile or compressively stressed films in the range between ±2 GPa. With special passivation layers such as CVD diamond layers, far higher stresses can be achieved up to the range of ±4 GPa. These values are in part already in the range of the tensile stress of an AlGaN barrier on non-tensioned, i.e. tension-free, GaN, which is already caused by the lattice mismatch of GaN to AlGaN. With an active layer concentration of 30%, the tensile stress of such a layer is approximately 3 GPa. A passivation layer that is applied on the active layer and that is very highly compressively stressed is therefore able to eliminate or even invert the piezoelectric components of the polarization vector in the active layer.

The level of the stress of a layer can be adjusted via the selected process parameters during its production. To calibrate the method, different layers are initially applied to a separate test wafer respectively and the stress generated by the respective process parameters is determined via the flexion of the wafer. However, it is also possible to directly determine the stress of a layer. A suitable method for doing so is fibDAC (D. Vogel, I. Maus and B. Michel, "fibDAC stress relief—A novel stress measurement approach with high spatial resolution", 3rd Electronics System Integration Technology Conference ESTC, Berlin, 2010, pp. 1-5).

It is possible that even with layers that are actually applied stress-free, these layers, too, can be slightly stressed due to production and material tolerances. According to the invention, therefore, layers with a normal tension of |σ|>_200 MPa are still described as stress-free. By contrast, layers with a normal tension of 200 MPa<|σ|>_1 GPa are described as moderately stressed, and layers with a normal tension of |σ|>1 GPa are described as highly stressed. With tensile-stressed layers, the normal tension is positive; with compressively stressed layers, it is negative.

The values given for the stress (mechanical tension) preferably relate to the arithmetic average of the local stress values of a layer in the area surrounding the gate. The local stress values preferably result from the vectorially added local normal tensions for different directions within a layer (e.g. for the three normal tension components σxx, σyy, σzz). Preferably, here, only normal tension components parallel to the active layer are taken into account, and these are arithmetically averaged via the layer depth. Preferably, the local stresses of a layer have a uniform size and direction, at least in the area surrounding the gate, i.e. the stress of the layer (at least in the area surrounding the gate) corresponds at every point to the local stress value. A spatial area directly adjacent to the gate, i.e. surrounding the gate, e.g. within a layer, is described as the area surrounding the gate. Preferably, an expansion of this surrounding area on a plane that encloses the recess in the passivation layer in the center corresponds to maximum twice, more preferably to maximum three times, more preferably maximum five times, and even more preferably maximum ten times the surface content of the recess size. A property defined in the area surrounding the gate can however also extend beyond this expansion determined as the surrounding area.

Preferably, the passivation layer has a thickness of between 10 nm and 1000 nm. Equally preferably, the recess has a width of between 10 nm and 500 nm on the boundary to the layer below. The ratio between these two parameters (aspect ratio between thickness and width) is preferably between 1.5:1 and 4:1, more preferably between 1.75:1 and 2.25:1, and even more preferably between 1.9:1 and 2.5:1. For example, the intermediate layer can have a thickness of between 275 nm and 325 nm and the recess on the boundary to the layer below can have a width of between 125 nm and 175 nm. The aspect ratio influences the parasitic properties of the transistors in interaction with the geometric dimensions of the metallic T-gate. Transistors for very high frequencies can have an aspect ratio of up to 4:1.

The idea of the present invention is that, in particular in heterojunction transistors (HFET) based on heterojunctions, the gate structure can be modified through a targeted combination with piezoelectric materials (e.g. AlN, GaN, InN or their ternary or quaternary compounds) in the active layer such that a local reduction or also an inversion of the piezoelectric vector can be achieved in the area below the gate. As a result, both a reduction and an increase in the local electron density in the 2DEG can be attained within this area.

The functionality of the transistor here depends on the type of piezomaterials used. For example, an active layer comprising AlGaN/GaN permits such a broad variation of the density parameters that depletion-type transistors (D-transistors) of the enrichment type (E-transistors) and/or the low-noise type (LN-type) (or also of the corresponding intermediate stages) can be constructed in the same material platform solely as a result of the piezoelectric properties of the materials used, i.e. without the local structural or material adjustments usually required in the active layer. A balancing out of the electrical properties of these materials, in particular their electrical polarization, can then be achieved through the targeted incorporation of mechanical tensions into the active layer.

Such local material stresses can be generated by applying and/or structuring dielectric layers that lie on the active layer and that are compressively and or tensile stressed. As a result of such external stresses, the local polarization vector of the active layer below can be influenced.

For example, with an HFET with an AlGaN/GaN heterojunction in the active layer, a local tensile stress in the AlGaN layer (caused by a corresponding stress in the layers applied above, which generate a corresponding "pulling" force effect on the surface of the active layer) can lead to a local increase in the electron density within the 2DEG of the transistor channel on the boundary between the AlGaN layer and the GaN layer. On the other hand, a corresponding locally compacting compressive stress through compression can lead to a local reduction in electron density in the channel area.

If the local compression of a piezoelectric layer is combined with a depletion zone generated by a Schottky barrier, an almost complete depletion of the channel area can be generated without hereby requiring a reduction in the density of the epitaxial layers of the active layer. Therefore, the input and output resistances of such self-blocking transistors (E-type) are not influenced by their gate structure or the type of production. In particular, for their production, the use of local gate recesses in the semiconductor material or p-gate structures according to the prior art that are difficult to construct are no longer required. Since the distance between the gate and the channel is not changed, neither the gate capacity nor the electrical fields in the area directly around the gate change.

Furthermore, due to the local setting of the piezoelectric properties of the active layer via selective structuring with applied dielectric layers, self-conducting transistors (D-type transistors) can be structured and produced in the same process sequence using additional local tensile stress. As a result, a considerably simplified E/D integration of these two types of transistors is made possible, in particularly in comparison with the prior art, without requiring local gate recesses in the semiconductor material or ion implantation methods being required for integration.

If, as a result of the stresses introduced into the active layer from above, the electron density within the 2DEG of the transistor channel on the boundary between the AlGaN layer and the GaN layer is set precisely such that the transconductance maximum in the switching behavior with a gate voltage UGS of 0 V occurs, a particularly low-noise transistor (LN-transistor) can be realized. With an LN-transistor, the electron density within the 2DEG therefore lies between the electron densities of E- and D-transistors. As a result, it becomes clear that through a corresponding setting of the stresses in the area around the gate, all three transistor types can be integrated with each other in the same material system in a simple manner.

In order to overcome the disadvantages occurring in the prior art, a considerable improvement in the electronic properties can also be achieved with short-channel HFETs due to the direct piezoelectric influencing of the channel area. In particular, as a result of a reduction according to the invention of the polarization charges in the active layer, such a strong reduction in the electron density in the 2DEG developed can be achieved that the depletion zone extends below the Schottky gate through into the buffer layer of a conventional active layer, the occurrence of typical short-channel effects is suppressed and a simpler pinch-off of the transistor is possible. Here, an additional reduction in the distance between the channel and the gate is not required.

The use of piezoelectric materials to change the local electron density within the active layer or within the channel area of a transistor has the following advantages in particular over the prior art:

1) No additional steps are required to produce gate recesses, to reduce the distance between the gate and the active layer or for ion implantation. Therefore, the crystal structure in the active layer below the gate is not damaged by unnecessary material changes, which contributes to an increase in the longevity and fail safety of the transistor.
2) The effects of a local compressive or tensile stress are dependent on the gate length, so that precisely with short gate lengths, an enhancement of the technical effect can be observed. With short-channel HFETs in particular, a particularly broad balancing out of the electronic properties can be conducted as a result. A gate structure according to the invention is therefore especially suitable for particularly fast switching transistors.
3) Since the self-conducting behavior is not adjusted via a reduction in the gate channel distance, the gate capacity of self-blocking transistors does not increase in comparison with self-conducting transistors. This enables extremely fast switching self-conducting transistors compared to the prior art.
4) The application of layers that are also differently tensioned is technologically very easy to implement in existing production processes. In particular, no additional further process steps are required for realization.
5) The epitaxial layers can have a greater thickness, as a result of which the overall capacity of the gate connection can be reduced. This means that the switching times of the transistors can be further reduced. This enables direct integration of the different transistor types.
6) The epitaxial layers can be designed such that in the feed area to and from the gate, a higher electron concentration is set. Through the integration of a compressively stressed passivation layer, the area below the gate can be specifically set such that the control behavior of the gate is optimal and no pinch-off problems arise. In this way, it is possible to reduce parasitic resistances such as the source or drain resistance of power transistors, and thus increase efficiency.
7) When integrating the individual transistor types, the feed resistance from source to gate and from gate to drain is not negatively impacted with the self-blocking transistors compared to the use of standard integration methods.
8) Due to the improved adjustability of the switching behavior of the transistors produced using stressed layers, the distance between the gate and the channel can be greater than with the structures common to date in the prior art, i.e. since the electrical fields near the gate are scaled with their distance from the channel, they are reduced considerably according to the invention. This reduces the leakage currents that occur and increases the reliability of the element. Further, due to an increased distance between the gate and channel with the self-blocking transistors, the input capacity can be within the same size range as for the self-conducting transistors. E/D-integrated circuits are therefore particularly suitable for applications in the micro- and mm-wave range.

9) The technological implementation of the production method is comparatively simple, low-cost, and compatible with most process lines.

In a first preferred embodiment of a gate structure according to the invention, the contact element directly contacts the active layer (the contact element and the active layer can however also be separated from each other by an intermediate gate insulator), is entirely enclosed towards the sides by the passivation layer and is covered from above the passivation layer by the cover layer.

In a second embodiment, a gate structure according to the invention further comprises an intermediate layer, wherein the intermediate layer is developed between the contact element and the passivation layer. In particular, due to the intermediate layer, a complete spatial separation can be achieved between the contact element and the passivation layer. Preferably, here, the intermediate layer completely covers the side walls of the recess of the passivation layer, wherein at least a partial area of the floor of the recess (i.e. the surface of the active layer) is directly connected with the contact element. The intermediate layer can extend until above the passivation layer. In particular, a section of the intermediate layer that extends above the passivation layer can also contribute to a spatial separation between the contact element and the passivation layer in the area above the passivation layer. With this embodiment, the cover layer can also in particular lie directly on the intermediate layer in the areas directly adjacent to the contact element and cover the contact element from above.

The intermediate layer can preferably be a dielectric layer made of SiNx. Equally preferred are SiOx, SiNxOy, Al2O3, ZnO, fluorosilicate glass (FSG), benzozyclobutene (BCB) and polyimides (PI). The thickness of the cover layer is preferably between 10 nm and 1000 nm. The intermediate layer can also be a spacer layer.

A first embodiment of an E-transistor according to the invention preferably has a gate structure according to the invention without an intermediate layer (first embodiment of a gate structure according to the invention), wherein the passivation layer is developed as a highly compressively stressed dielectric layer with a normal tension of $\sigma<-1$ GPa, and the cover layer is developed as a compressively stressed dielectric layer with a normal tension of $\sigma<-200$ MPa. The individual compressive stresses in the two layers interact and generate a targeted force effect on the surface of the active layer, which leads via the direct piezo effect to a local change in the electrical polarization within the active layer. The strength of this effect can here be set and controlled e.g. by the type of individual layer materials (active layer, passivation layer, cover layer), their thickness ratio, the geometric dimensions of the individual structure elements and the respective level of the realized compressive stress. In particular, as a result, a complete depletion of the transistor channel can also be achieved since the depletion area can extend into the semi-insulated buffer layer of a conventional active layer.

A second embodiment of an E-transistor according to the invention preferably has a gate structure according to the invention with an intermediate layer (second embodiment of a gate structure according to the invention), wherein the passivation layer is developed as a tension-free or moderately compressively or moderately tensile stressed dielectric layer with a normal tension of $-1$ GPa$\leq\sigma\leq1$ GPa, the intermediate layer is developed as a highly compressively stressed dielectric layer with a normal tension of $\sigma<-1$ GPa, and the cover layer is developed as a compressively stressed dielectric layer with a normal tension of $\sigma<-200$ MPa. With this embodiment, too, the electric polarization is locally changed within the active layer via the individual compressive stresses. In particular, here, a layer is produced mainly via the intermediate layer and cover layer, while the passivation layer only makes a low-level contribution, or none at all, to the stress input.

A first embodiment of a D-transistor according to the invention preferably has a gate structure according to the invention without an intermediate layer (first embodiment of a gate structure according to the invention), wherein the passivation layer is developed as a moderately tensile stressed dielectric layer with a normal tension of 200 MPa$<\sigma\leq1$ GPa, and the cover layer is developed as a tensile stressed dielectric layer with a normal tension of $\sigma>200$ MPa.

A second embodiment of a D-transistor according to the invention preferably has a gate structure according to the invention with an intermediate layer (second embodiment of a gate structure according to the invention), wherein the intermediate layer and the cover layer are developed as highly tensile stressed dielectric layers with normal tensions of $\sigma>1$ GPa, and the passivation layer is developed as a tension-free or moderately compressively or moderately tensile stressed dielectric layer with a normal tension of $-1$ GPa $5\leq\sigma\leq1$ GPa.

With the embodiments of a D-transistor according to the invention given as examples above, the individual stresses in the layers interact and also generate a targeted force effect on the surface of the active layer, which leads via the direct piezo effect to a local change in the electrical polarization within the active layer. With a D-transistor, the strength of this effect can here be set and controlled e.g. by the type of individual layer materials (active layer, passivation layer, intermediate layer, cover layer), their thickness ratio, the geometric dimensions of the individual structure elements and the respective level of the realized compressive stress.

Through the selective stress, at least one layer disposed above the active layer in the area around the contact element, the force effect can be specifically influenced on the surface of the active layer in the area directly around the contact element. In particular, through a local variation of the electrical polarization within the active layer, the depletion area below the gate can be reduced in relation to an E-transistor according to the invention, which can be based on the same epitaxy structure, so that as a result, a transistor behavior of the depletion type (D-type) can be set.

A first embodiment of an LN-transistor according to the invention preferably has a gate structure according to the invention without an intermediate layer (first embodiment of a gate structure according to the invention), wherein the passivation layer and the cover layer are developed as moderately compressively stressed dielectric layers with normal tensions of $-1$ GPa$\leq\sigma<-200$ MPa.

A second embodiment of an LN-transistor according to the invention preferably has a gate structure according to the invention with an intermediate layer (second embodiment of a gate structure according to the invention), wherein the intermediate layer and the cover layer are developed as moderately compressively stressed dielectric layers with normal tensions of $-1$ GPa$\leq\sigma<-200$ MPa, and the passivation layer is developed as a tension-free or moderately tensile stressed dielectric layer with a normal tension of 0 GPa$\leq\sigma\leq1$ GPa.

With an LN transistor, the transconductance maximum occurs in the switching behavior with a gate voltage $U_{GS}$ of 0 V. With an LN-transistor according to the invention, the corresponding switching behavior of an LN-transistor is therefore also present alongside the stresses in the individual layers given for the individual embodiments. In particular, the stresses in the individual layers are selected such that a corresponding switching behavior of an LN-transistor is set.

A further aspect of the present invention relates to a circuit arrangement, comprising at least one E-transistor according to the invention and at least one D-transistor according to the invention, wherein the E-transistor and the D-transistor are disposed on a shared substrate (E/D integration). Such an integrated circuit arrangement has e.g. the advantage that the comprised self-conducting and self-blocking transistors, in particular on the shared substrate, can be constructed as an active layer in one and the same epitaxy structure. A local change to the epitaxy structure that is dependent on the transistor type, e.g. through etching, thinning or by means of ion implantation, is not required here. The differences in switching behavior are generated solely by the layers applied on top of the active layer via their local mechanical stresses and their interaction with the piezoelectric polarization vectors within the active layer. The term "disposed on a shared substrate" here preferably means the same as "disposed on a shared active layer".

Furthermore, the invention enables the realization of a D-transistor in conjunction with an LN-transistor (D/LN integration). LN-transistors are suitable as low-noise amplifier stages and enable the monolithic integration of receivers and transmitter components on a chip (transceiver). Therefore, a further aspect of the present invention relates to a circuit arrangement, comprising at least one D-transistor according to the invention and at least one LN-transistor according to the invention, wherein the D-transistor and the LN-transistor are disposed on a shared substrate.

However, the integration of an E-transistor is also possible in conjunction with an LN-transistor (E/LN integration). A corresponding circuit arrangement comprises at least one E-transistor according to the invention and at least one LN-transistor according to the invention, wherein the E-transistor and the LN-transistor are disposed on a shared substrate.

For complex circuit arrangements, all transistor types given above can also be integrated on a shared substrate or epitaxy base (E/D/LNA integration). Here, corresponding logic circuitry could also be integrated on the chip for the direct processing and conversion of the transferred signals. A corresponding circuit arrangement, comprising at least one E-transistor according to the invention and at least one D-transistor according to the invention, and at least one LN-transistor according to the invention, wherein the transistors are disposed on a shared substrate.

A first embodiment of a method according to the invention for producing a gate structure is in particular designed to produce a gate structure according to the invention, and comprises the provision of a substrate with a piezoelectric active layer disposed on the substrate; the application of a dielectric passivation layer with a first stress value on the active layer, wherein the passivation layer has a thickness of between 10 nm and 1000 nm; the production of a recess in the passivation layer, wherein the recess extends through the entire passivation layer in the direction of the active layer, and on the boundary to the active layer has a width between 10 nm and 500 nm, wherein the ratio between the thickness of the passivation layer and the width of the recess on the boundary to the active layer is between 1.5:1 and 4:1; the development of a contact element disposed within the recess, wherein the contact element extends from the active layer to above the passivation layer; and the application of a cover layer with a second stress value that covers the contact element above the passivation layer; wherein the development of at least one layer disposed above the active layer is tensile stressed or compressively stressed in the area around the contact element with a normal tension of $|\sigma|>200$ MPa, wherein via the individual stresses in the area around the contact element, a resulting force on the boundary area between the passivation layer and the active layer is set, which influences via the piezoelectric effect the electron density in the active layer in the area below the contact element, wherein the normal tensions of stressed layers lie in the range between ±4 GPa.

The production of a recess in the passivation layer can be achieved in such a manner that a suitable resist layer for the electron ray lithography or the optical lithography is applied onto the intermediate layer and by means of a corresponding lithography stage, an etching mask is produced in the resist layer to develop the recess in the intermediate layer. Preferred resist materials are e.g. ZEP 520A, PMMA, PMGI, copolymers and LOR.

The recess in the passivation layer can then be produced using a structuring method suitable for the passivation layer. Due to the internal stress of a layer disposed above the active layer, the surface of the active layer in the area of the lower corners of the recess is either pressed or pulled locally, in each case depending on the type of stress. Due to this external mechanical load resulting from the introduced stress, in the active layer, a local reinforcement or reduction of the piezoelectric vector may occur within the material of the active layer.

With regard to the advantages and technical effects of the method, reference is made to the relevant places in the description relating to the gate structure according to the invention and the transistor types derived from it and their integration. The embodiments given there and their features stated as being preferred can be directly adopted in the corresponding method.

In particular, in structures with an AlGaN/GaN heterojunction, the polarization of the active material plays a key role in the development of a 2DEG, so that those areas of the active layer that have a changed polarization vector compared to their environment due to the load effect arising from the mechanical stress are enriched or depleted with charge carriers (electrons or holes, in each case depending on the original alignment of the piezoelectric vector in the materials and material systems used).

In a second embodiment, the method for producing a gate structure further comprises, prior to the development of a contact element disposed within the recess, the application of an intermediate layer with a third stress value within the recess, wherein the intermediate layer is developed between the contact element and the passivation layer; and the production of a second recess in the intermediate layer, wherein the second recess extends through the entire intermediate layer in the direction of the active layer. The recess in the intermediate layer can be produced analogously to the production of a recess in the passivation layer described above.

The stress values named in the method are in each case the normal tensions a in the layer. Numerals are provided solely for a clearer overview with regard to the individual layers. In particular, stress values that are not specified using the method according to the invention can take on any values. In particular, the stress value of a layer can also take on the value zero (stress-free layer).

A further aspect of the present invention relates to an integration method for producing a circuit arrangement according to the invention, wherein at least two different transistor types according to the invention (E-, D- or LN-transistor) are produced according to a method according to the invention on a shared substrate.

BRIEF DESCRIPTION OF THE DRAWINGS

The invention will now be explained in greater detail below with reference to the related drawings, in which.

DETAILED DESCRIPTION OF THE DRAWINGS

Figure 1:
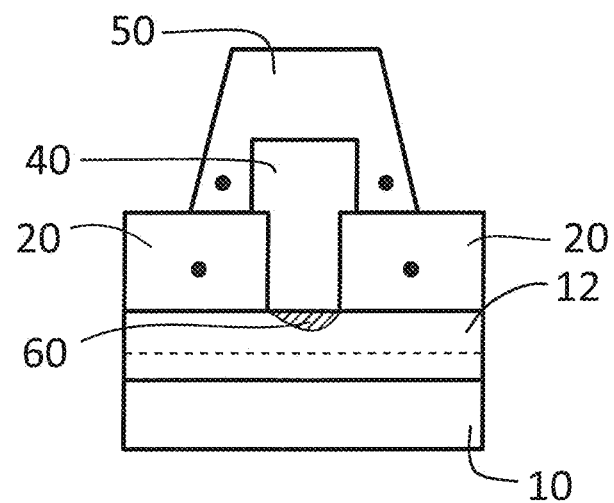
FIG. 1 shows a schematic setup of a conventional gate structure according to the prior art.

FIG. 1 shows a schematic setup of a conventional gate structure according to the prior art. This is in particular a T-gate, as is typically used in an HEMT or HFET. The drawing shows a gate structure with a substrate 10; an active layer 12 disposed on the substrate 10; a passivation layer 20 disposed on the active layer 12, wherein the passivation layer 20 has a recess, which extends through the entire passivation layer 20 in the direction of the active layer 12; a contact element 40 disposed within the recess, wherein the contact element 40 extends from the active layer 12 to above the passivation layer 20; and a cover layer 50, which covers the contact element 40 above the passivation layer 20.

The active layer 12 is here usually present as an epitaxy structure of particularly high purity and quality that is carried by the substrate. The passivation layer 20 and the cover layer 50 are applied as stress-free as possible during the subsequent structuring in the prior art, so that no mechanical loads occur in the materials. Punctual loads in particular can interfere with the electrical properties of the transistor and have a negative impact on the production yield and longevity of the individual components. The stress-free state of the layers 20, 50 is indicated by the dots drawn in (insignificant stress vectors).

Further, a typical depletion area 60 of an AlGaN/GaN HFET produced with standard technology on the basis of relaxed dielectric layers 20, 50 is shown. The depletion area 60 only moderately extends into the active layer 12. In order to achieve a significant influencing of the depletion area 60 with the same structure sizes, to date, it was usually necessary to interfere with the epitaxy structure of the active layer via the processing technology, for example by making structural changes or through ion implantation. With short-channel transistors in particular, such interferences can weaken short-channel effects that occur. The usual methods for setting the depletion area 60 are very time-consuming, however (additional process stages) and can reduce the originally very high quality of the epitaxy layer.

Figure 2:
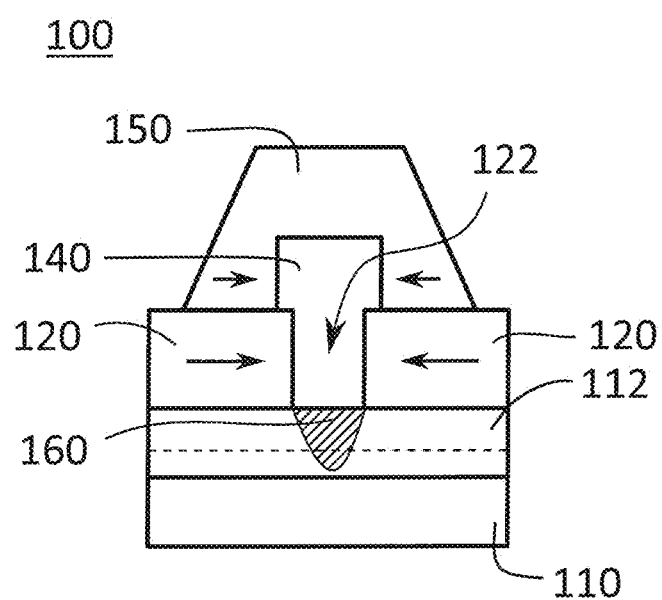
FIG. 2 shows a schematic setup of a first embodiment of a gate structure according to the invention (E-transistor)

FIG. 2 shows a schematic setup of a first embodiment of a gate structure according to the invention. Here, too, this can in particular be a T-gate for an HEMT or HFET. The drawing shows a gate structure with a substrate 110; an active layer 112 disposed on the substrate 110; a passivation layer 120 disposed on the active layer 112, wherein the passivation layer 120 has a recess, which extends through the entire passivation layer 120 in the direction of the active layer 112; a contact element 140 disposed within the recess, wherein the contact element 140 extends from the active layer 112 to above the passivation layer 120; and a cover layer 150, which covers the contact element 140 above the passivation layer 120, wherein the passivation layer 120 is developed as a highly compressively stressed dielectric layer with a normal tension of $\sigma < -1$ GPa. Here, the cover layer 150 is also developed as a highly compressively stressed dielectric layer with a normal tension of $\sigma < -1$ GPa. In particular, the gate structure shown can be a gate structure of an E-transistor 100 according to the invention (first embodiment of a gate structure according to the invention). Through an adaptation according to the invention of the stress values in the layers, the switching behavior of a D-transistor can however also be set while retaining the structural composition.

The active layer 112 can be present as an epitaxy structure of particularly high purity and quality that is carried by the substrate 110. The passivation layer 120 and the cover layer 150 produce a targeted force effect on the surface of the active layer, which either pushes or pulls the surface of the active layer, particularly in the area of the lower corners of the recess, in each case depending on the type of stress. Due to the compressively stressed dielectric layers 120, 150 that have been drawn in, the surface of the active layer is therefore pressed in these areas, which is illustrated in FIG. 2 by the stress vectors that have been drawn in.

The compressive stress of the passivation layer 120 means that the passivation layer 120 is in each case pressed in the direction of the recess 122. The stress effect thus mainly has an impact in the area below the gate. Even if, as is the case with a T-gate, the material of the contact element 140 (e.g. a Schottky metal) partially covers the passivation layer 120, the stress effect essentially remains limited to the area below the gate. Also, the additional coverage of the contact element 140 below the passivation layer 120 with a dielectric cover layer 150 that is also compressively stressed makes no change to this limitation of the effect used. Due to an additional stress of the cover layer 150, the influence of the stressed passivation layer 120 can be further reinforced, however, or also weakened if necessary (through inverse polarity of the stress vector). The strengths of the individual stresses can be combined to result in a total force effect on the surface of the active layer 112.

Compared to the drawing of the typical depletion area 60 shown in FIG. 1 of an AlGaN/GaN HFET produced using standard technology on the basis of dielectric layers 20, 50, the depletion area 160 of a gate structure according to the invention in the first embodiment shows a considerably more efficient charge carrier depletion within the transistor channel. Due to the increased effectiveness of the charge carrier depletion, with short-channel transistors, for example, the short-channel effects that otherwise occur can also be weakened or suppressed without interfering in the active layer via the process technology. In particular, through the combination of two compressively stressed dielectric layers 120, 150, a full depletion of the transistor channel can also be achieved. This is made possible when the depletion area extends into the semi-insulating buffer layer of a conventional active layer 112.

Figure 3:
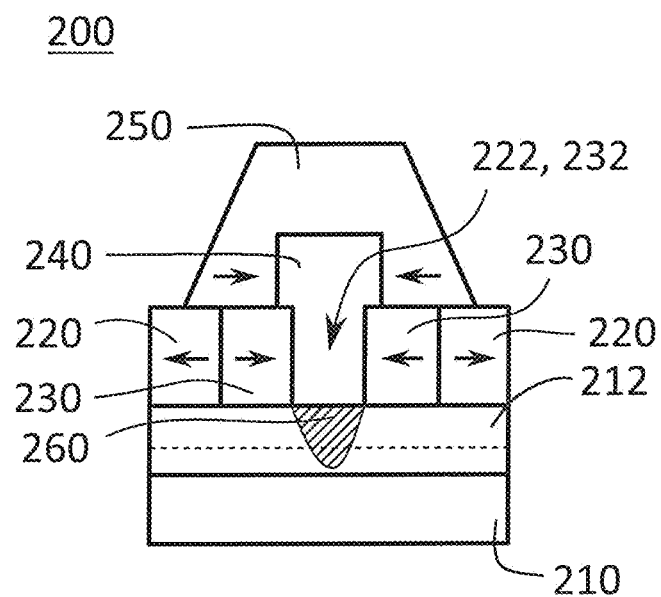
FIG. 3 shows a schematic setup of a second embodiment of a gate structure according to the invention (E-transistor)

FIG. 3 shows a schematic setup of a second embodiment of a gate structure according to the invention. Here, too, this can in particular be a T-gate for an HEMT or HFET. The drawing shows a gate structure with a substrate 210; an active layer 212 disposed on the substrate 210; a passivation layer 220 disposed on the active layer 212, wherein the passivation layer 220 has a recess, which extends through the entire passivation layer 220 in the direction of the active layer 212; a contact element 240 disposed within the recess, wherein the contact element 240 extends from the active layer 212 to above the passivation layer 220; and a cover layer 250, which covers the contact element 240 above the passivation layer 220, wherein the passivation layer 220 is developed as a tension-free or moderately compressively stressed or moderately tensile stressed dielectric layer with a normal tension of $-1$ GPa$\leq\sigma\leq 1$ GPa. The gate structure shown further has an intermediate layer 230, wherein the intermediate layer 230 is developed between the contact element 240 and the passivation layer 220. The intermediate layer 230 is developed as a highly compressively stressed dielectric layer with a normal tension of $\sigma<-1$ GPa. The cover layer 250 is developed as a highly compressively stressed dielectric layer with a normal tension of $\sigma<-200$ MPa. In particular, the gate structure shown can be the gate structure of an E-transistor 200 according to the invention (second embodiment of a gate structure according to the invention). Through an adaptation according to the invention of the stress values in the layers, the switching behavior of a D-transistor can however also be set while retaining the structural composition.

The composition of the active layer 212 and the descriptions of the impact of the individual stresses are the same as those described in relation to FIG. 2. In the area of the intermediate layer 230, however, the compressive stress comes into effect, the impact of which on the active layer 212 is generally precisely the inverse of the impact of a tensile stress. Due to the compressively stressed intermediate layer 230, the surface of the active layer 212 is above all mechanically stressed in the area of the lower corners of the second recess 232, which is also illustrated in FIG. 3 by the stress vectors that have been drawn in.

The compressive stress of the intermediate layer 230 means that the intermediate layer 230 is in each case pressed in the direction of the recess 232. Here, too, the stress effect thus mainly has an impact in the area below the gate. Also, the additional coverage of the contact element 240 below the passivation layer 220 with a dielectric cover layer 250 that is also compressively stressed makes no change to this limitation of the effect exploited. Due to an additional stress of the cover layer 250, the effect of the stressed passivation layer 220 can be again reinforced, however, or also weakened if necessary (through inverse polarity of the stress vector). With this embodiment of a gate structure according to the invention, too, the strengths of the individual stresses can be combined to result in a total force effect on the surface of the active layer 212.

Compared to the drawing of the depletion area 160 of the first embodiment of a gate structure according to the invention shown in FIG. 2, the depletion area 260 of a gate structure according to the invention in the second embodiment presents a similarly efficient opportunity to control the charge carrier depletion within the transistor channel while otherwise retaining the same parameters. Due to the compressive stress of the dielectric intermediate layer 230, a complete depletion of the transistor channel can be achieved (E-transistor). This opportunity for controlling the charge carrier depletion is particularly advantageous within the scope of E/D integration, since thus, E- and D-transistors can be constructed as an active layer 212 on a shared substrate in the same epitaxy structure without interfering in the active layer via the processing technology.

Figure 4:
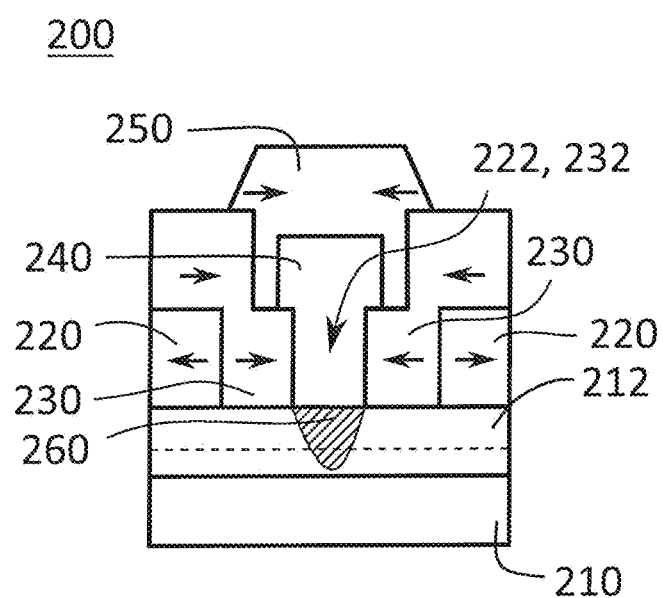
FIG. 4 shows a schematic setup of an alternative second embodiment of a gate structure according to the invention (E-transistor)

FIG. 4 shows a schematic setup of an alternative second embodiment of a gate structure according to the invention. The drawing shown largely corresponds to the drawing shown in FIG. 3, and the reference numerals and their assignment apply accordingly. In contrast to FIG. 3, with the gate structure according to the invention shown, the intermediate layer 230 extends until above the passivation layer 220 and at least partially also lies on it. As a result, in particular, a potential compressive stress of the passivation layer 220 below can be at least partially compensated, so that the geometric formation of the intermediate layer 230 can also be considered as an additional balancing out parameter.

Figure 5:
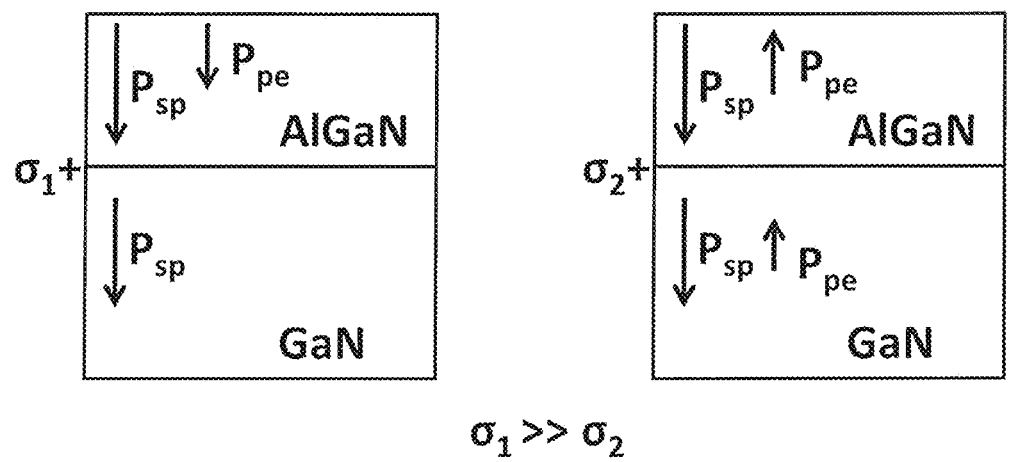
FIG. 5 shows a schematic view of the spontaneous and piezoelectric polarization vectors in the prior art (left) and the polarization vectors of a preferred embodiment of a gate structure according to the invention (right)

FIG. 5 shows a schematic view of the spontaneous and piezoelectric polarization vectors in the prior art and the polarization vectors of a preferred embodiment of a gate structure according to the invention. In particular, this can be a transistor with an AlGaN/GaN heterojunction in the active layer on the Ga side. If no external forces act from the outside on the active layer (left), an intrinsic tensile stress of the AlGaN can occur due to the lattice mismatch with GaN. By contrast, the GaN layer is usually stress-free due to a comparatively high material thickness (typically 1 μm to 6 μm). In this case, only a spontaneous polarization vector can be defined in the GaN layer, while in the tensile stressed AlGaN layer, the spontaneous and the piezoelectric polarization vector are colinearly aligned.

If in addition, an external compressive stress now acts on the active layer (right), the piezoelectric polarization vector in the AlGaN layer can be locally weakened or even inverted. As a result, the total polarization in the AlGaN layer is weakened, as a result of which fewer polarization charges are present on the AlGaN/GaN heterojunction. However, due to the compressive stress, the GaN layer is also locally compacted, so that as a result of the additional polarization vector thus produced, the total polarization on the AlGaN/GaN heterojunction is further reduced. The local decrease in polarization charges on the AlGaN/GaN heterojunction thus arising in turn leads to a reduction in electron density σ in the 2DEG, which can lead to an expansion of the depletion area below a Schottky gate through into the buffer layer of a conventional active layer. If the compression-induced stress extends through into the GaN buffer layer, the effect can however also be offset under certain circumstances, since the electron density in the channel depends on the difference between the totals of the respective polarization charges in the AlGaN and GaN. If the GaN and AlGaN are compressively stressed in the same manner and are similar to the spontaneous and piezoelectric piezo coefficients, no effect can be observed, or the effect is too minor. The piezo constants in the AlGaN are however higher than those of the GaN, so that the effect tends to decrease. It is preferred, however, when the active layer is itself tension-free.

Otherwise, the piezoelectric polarization vectors show highly analogous inverse behavior with an external compressive stress on the surface of the active layer. A local increase in the polarization charges on the AlGaN/GaN heterojunction here creates an increase in the electron density σ in the 2DEG. The extension of the depletion area below a Schottky gate can thus be reduced compared to a stress-free design of the same structure. Thus, a flexible local control of the electron density σ in the 2DEG below the transistor gate is enabled, which can in particular be used for simple E/D integration.

Figure 6:
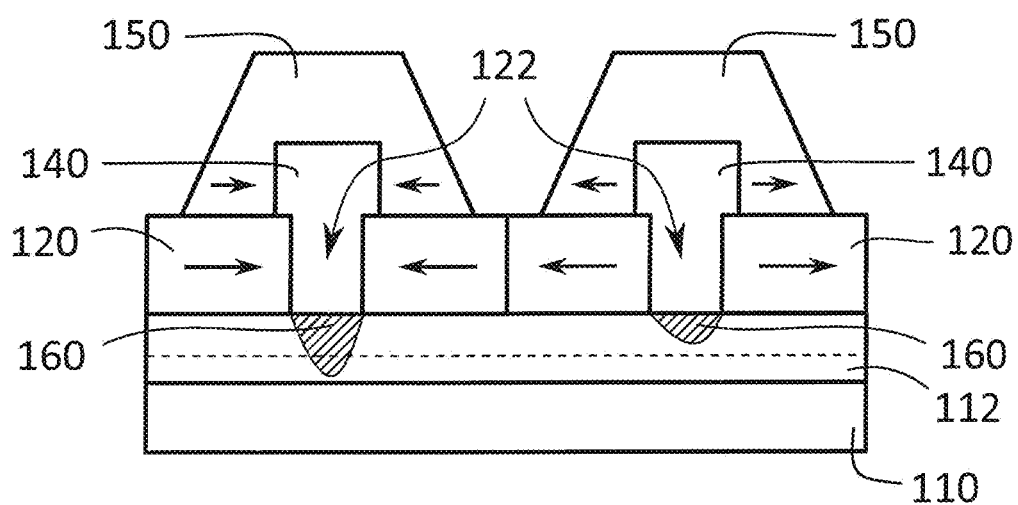
FIG. 6 shows a schematic setup of a second embodiment of a circuit arrangement according to the invention (E/D integration).

FIG. 6 shows a schematic setup of an embodiment of a circuit arrangement according to the invention. In particular, this is an E/D integration, in which an E-transistor 100 according to the invention, in particular a first embodiment of an E-transistor 100 according to the invention as shown in FIG. 2 (with a gate structure according to the invention without an intermediate layer 230) and a D-transistor according to the invention, in particular a first embodiment of a D-transistor according to the invention (gate structure according to the invention without an intermediate layer 230) are disposed on a shared substrate 110. Since the corresponding embodiments of the two transistors do not differ from each other in terms of their structure, the reference numerals and their respective assignment correspond to those provided in the description of FIG. 2.

It can be seen from this drawing, in particular with reference to the depletion zones 160 that have been drawn in, that by means of a variation according to the invention of the stresses in the individual layers, the switching behavior of adjacent transistors can be changed, without requiring additional structuring in order to locally influence the electron density within the active layer 112. Thus, an E/D integration according to the invention can be conducted on a shared substrate 100 or on a shared active layer 112. Accordingly, the circuit arrangement according to the invention can also comprise the integration of LN-transistors according to the invention with E- or D-transistors 100 or a shared integration of all described transistor types. The use of embodiments with or without an intermediate layer 230 here depends on the stress values required in each case for the individual gate structures, and on specifications regarding the layer systems used.

LIST OF REFERENCE NUMERALS

10 Substrate
12 Active layer
20 Passivation layer
40 Contact element
50 Cover layer
60 Depletion area
100 E-transistor
110 Substrate
112 Active layer
120 Passivation layer
122 Recess
140 Contact element
150 Cover layer
160 Depletion area
200 E-transistor
210 Substrate
212 Active layer
220 Passivation layer
222 Recess
230 Intermediate layer
232 Second recess
240 Contact element
250 Cover layer
260 Depletion area

The invention claimed is:

1. A transistor structure, comprising:
a) a substrate (110, 210);
b) a piezoelectric active layer (112, 212), having a heterojunction, disposed on the substrate (110, 210);
c) a dielectric passivation layer (120, 220) disposed on the active layer (112, 212) and having a thickness of between 10 nm and 1000 nm, wherein the passivation layer (120, 220) has a recess (122, 222) that extends through the entire passivation layer (120, 220) in the direction of the active layer (112, 212), wherein the recess (122, 222) has a width between 10 nm and 500 nm on the boundary to the active layer (112, 212) and the ratio between the thickness of the passivation layer (120, 220) and the width of the recess (122, 222) at the boundary to the active layer (112, 212) is between 1.5:1 and 4:1;
d) a gate contact element (140, 240) disposed within the recess (122, 222), wherein the contact element (140, 240) extends from the active layer (112, 212) to above the passivation layer (120, 220); and
e) a cover layer (150, 250) that covers the contact element (140, 240) above the passivation layer (120, 220); characterized in that
f) at least one layer (120, 220, 150, 250, 230) disposed above the active layer (112, 212) is tensile stressed or compressively stressed in the area around the contact element (140, 240) with a normal tension of |σ|>1 GPa, or the cover layer is tensile stressed in the area around the contact element (140, 240) with a normal stress of σ>200 MPa,
g) wherein via the individual stresses in the area around the contact element (140, 240), a resulting force on the boundary area between the passivation layer (120, 220) and the active layer (112, 212) is set, which influences via the piezoelectric effect the electron density in the active layer (112, 212) in the area below the contact element (140, 240), wherein the normal tensions of stressed layers lie in the range between ±4 GPa.

2. The transistor structure according to the generic term of claim 1, characterized in that
f) the transistor structure further comprises an intermediate layer (230), wherein the intermediate layer (230) is developed between the contact element (240) and the passivation layer (220);
g) at least one layer (120, 220, 150, 250, 230) disposed above the active layer (112, 212) is tensile stressed or compressively stressed in the area around the contact element (140, 240) with a normal tension of |σ|>200 MPa;
h) wherein via the individual stresses in the area around the contact element (140, 240), a resulting force on the boundary area between the passivation layer (120, 220) and the active layer (112, 212) is set, which influences via the piezoelectric effect the electron density in the active layer (112, 212) in the area below the contact element (140, 240), wherein the normal tensions of stressed layers lie in the range of between ±4 GPa.

3. An E-transistor (200) with a transistor structure according to claim 2, wherein the passivation layer (220) is developed as a tension-free or moderately compressively or moderately tensile stressed dielectric layer with a normal tension of −1 GPa≤σ≤1 GPa, the intermediate layer (230) is developed as a highly compressively stressed dielectric layer with a normal tension of σ<−1 GPa, and the cover layer (250) is developed as a compressively stressed dielectric layer with a normal tension of σ<−200 MPa.

4. A D-transistor with a transistor structure according to claim 2, wherein the intermediate layer (230) and the cover layer (250) are developed as highly tensile stressed dielectric layers with normal tensions of σ>1 GPa, and the passivation layer (220) is developed as a tension-free or moderately compressively or moderately tensile stressed dielectric layer with a normal tension of 1 GPa≤σ≤1 GPa.

5. An LN-transistor with a gate structure according to claim 2, wherein the intermediate layer (230) and the cover layer (250) are developed as moderately compressively stressed dielectric layers with normal tensions of −1 GPa≤σ<−200 MPa, and the passivation layer (220) is developed as a tension-free or moderately tensile stressed dielectric layer with a normal tension of 0 GPa≤σ≤1 GPa.

6. The transistor structure according to claim 1, wherein the passivation layer (120, 220) is developed as a highly compressively or tensile stressed dielectric layer with a normal tension of |σ|>1 GPa.

7. An E-transistor (100) with a transistor structure according to claim 1, wherein the passivation layer (120) is developed as a highly compressively stressed dielectric layer with a normal tension of σ<−1 GPa and the cover layer (150) is developed as a compressively stressed dielectric layer with a normal tension of σ<−200 MPa.

8. A D-transistor with a transistor structure according to claim 1, wherein the passivation layer (120) is developed as a moderately tensile stressed dielectric layer with a normal tension of 200 MPa<σ≤1 GPa and the cover layer (150) is developed as a tensile stressed dielectric layer with a normal tension of σ>200 MPa.

9. A method for producing a transistor structure, comprising the following steps:
 a) providing a substrate (110, 210) with a piezoelectric active layer (112, 212) having a heterojunction disposed on the substrate (110, 210);
 b) applying a dielectric passivation layer (120, 220) with a first stress value onto the active layer (112, 212), wherein the passivation layer (120, 220) has a thickness of between 10 nm and 1000 nm;
 c) producing a recess (122, 222) in the passivation layer (120, 220), wherein the recess (122, 222) extends through the entire passivation layer (120, 220) in the direction of the active layer (112, 212) and on the boundary to the active layer (112, 212) has a width of between 10 nm and 500 nm, wherein the ratio between the thickness of the passivation layer (120, 220) and the width of the recess (122, 222) on the boundary to the active layer (112, 212) is between 1.5:1 and 4:1;
 d) developing a gate contact element (140, 240) disposed within the recess (122, 222), wherein the contact element (140, 240) extends from the active layer (112, 212) to above the passivation layer (120, 220);
 e) applying of a cover layer (150, 250) with a second stress value, which covers over the contact element (140, 240) above the passivation layer (120, 220); characterized in that
 f) the development of at least one layer (120, 220, 150, 250) disposed above the active layer (112, 212) is conducted in a tensile stressed or compressively stressed manner in the area around the contact element (140, 240) with a normal tension of |σ|>1 GPa, or the development of the cover layer is conducted in a tensile stressed manner with a normal tension of σ>200 MPa, wherein via the individual stresses in the area around the contact element (140, 240), a resulting force on the boundary area between the passivation layer (120, 220) and the active layer (112, 212) is set, which influences via the piezoelectric effect the electron density in the active layer (112, 212) in the area below the contact element (140, 240), wherein the normal tensions of stressed layers lie in the range between ±4 GPa.

10. A method for producing a gate structure according to the generic term of claim 9, characterized in that before developing a gate contact element (240) disposed within the recess (222), the following further steps are comprised:
 c') applying an intermediate layer (230) with a third stress within the recess (222), wherein the intermediate layer (230) is developed between the contact element (240) and the passivation layer (220);
 c") producing a second recess (232) in the intermediate layer (230), wherein the second recess (232) extends through the entire intermediate layer (230) in the direction of the active layer (212);
 f) wherein the development of at least one layer (120, 220, 150, 250) disposed above the active layer (112, 212) is conducted in a tensile stressed or compressively stressed manner in the area around the contact element (140, 240) with a normal tension of |σ|>200 MPa, wherein via the individual stresses in the area around the contact element (140, 240), a resulting force on the boundary area between the passivation layer (120, 220) and the active layer (112, 212) is set, which influences via the piezoelectric effect the electron density in the active layer (112, 212) in the area below the contact element (140, 240), wherein the normal tensions of stressed layers lie in the range between ±4 GPa.

* * * * *